United States Patent
Duan et al.

(10) Patent No.: US 10,319,591 B2
(45) Date of Patent: Jun. 11, 2019

(54) GEOMETRIC CONTROL OF BOTTOM-UP PILLARS FOR PATTERNING APPLICATIONS

(71) Applicant: Applied Materials, Inc., Santa Clara, CA (US)

(72) Inventors: Ziqing Duan, San Jose, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/805,753

(22) Filed: Nov. 7, 2017

(65) Prior Publication Data
US 2018/0130657 A1 May 10, 2018

Related U.S. Application Data

(60) Provisional application No. 62/419,228, filed on Nov. 8, 2016.

(51) Int. Cl.
| H01L 21/033 | (2006.01) |
| H01L 21/3105 | (2006.01) |
| H01L 21/311 | (2006.01) |
| H01L 21/321 | (2006.01) |
| H01L 21/768 | (2006.01) |

(52) U.S. Cl.
CPC .... *H01L 21/0337* (2013.01); *H01L 21/31053* (2013.01); *H01L 21/31116* (2013.01); *H01L 21/32105* (2013.01); *H01L 21/768* (2013.01)

(58) Field of Classification Search
CPC ......... B06B 1/0688; G06F 2203/04103; G06F 3/016; G06F 3/041; G06F 3/0414; H01L 21/0337; H01L 21/31053; H01L 21/31116; H01L 41/053; H01L 41/081; H01L 21/32105
USPC ....... 438/706, 710, 712, 714, 717, 719, 723, 438/736, 422, 431, 445, 738; 216/40, 41
See application file for complete search history.

(56) References Cited

U.S. PATENT DOCUMENTS

| 8,575,753 B2 | 11/2013 | Choi et al. | |
| 2005/0266627 A1* | 12/2005 | Furukawa | B82Y 10/00 438/197 |
| 2006/0286806 A1* | 12/2006 | Ohkuni | H01L 21/31116 438/710 |
| 2009/0017631 A1 | 1/2009 | Bencher | |
| 2009/0174040 A1 | 7/2009 | Gogoi et al. | |
| 2010/0096691 A1* | 4/2010 | Shin | H01L 21/823487 257/329 |
| 2013/0109148 A1 | 5/2013 | Oh et al. | |

(Continued)

FOREIGN PATENT DOCUMENTS

WO 2016/106092 A1 6/2016

OTHER PUBLICATIONS

PCT International Search Report and Written Opinion in PCT/US2017/060368 dated Jan. 31, 2018, 11 pages.

*Primary Examiner* — Lan Vinh
(74) *Attorney, Agent, or Firm* — Servilla Whitney LLC

(57) ABSTRACT

Processing methods comprising selectively replacing a first pillar material with a second pillar material in a self-aligned process are described. The first pillar material may be grown orthogonally to the substrate surface and replaced with a second pillar material to leave a substantially similar shape and alignment as the first pillar material.

20 Claims, 15 Drawing Sheets

(56) References Cited

U.S. PATENT DOCUMENTS

2015/0357439 A1 12/2015 Liu et al.
2016/0049427 A1* 2/2016 Zang .................. H01L 27/1211
　　　　　　　　　　　　　　　　　　　257/347

* cited by examiner

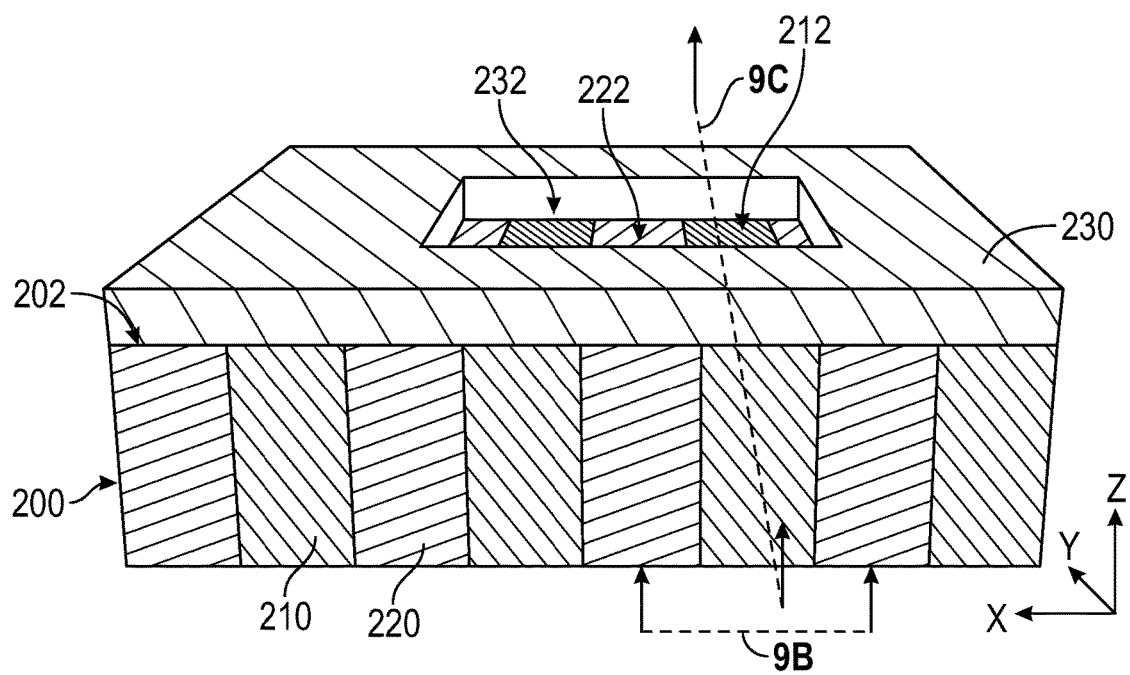
FIG. 9A
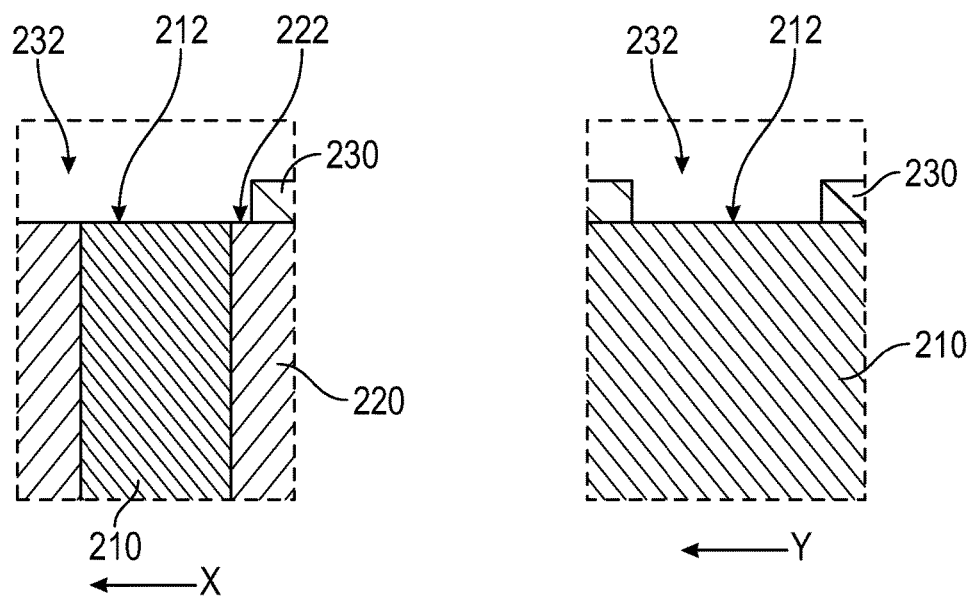
FIG. 9B
FIG. 9C

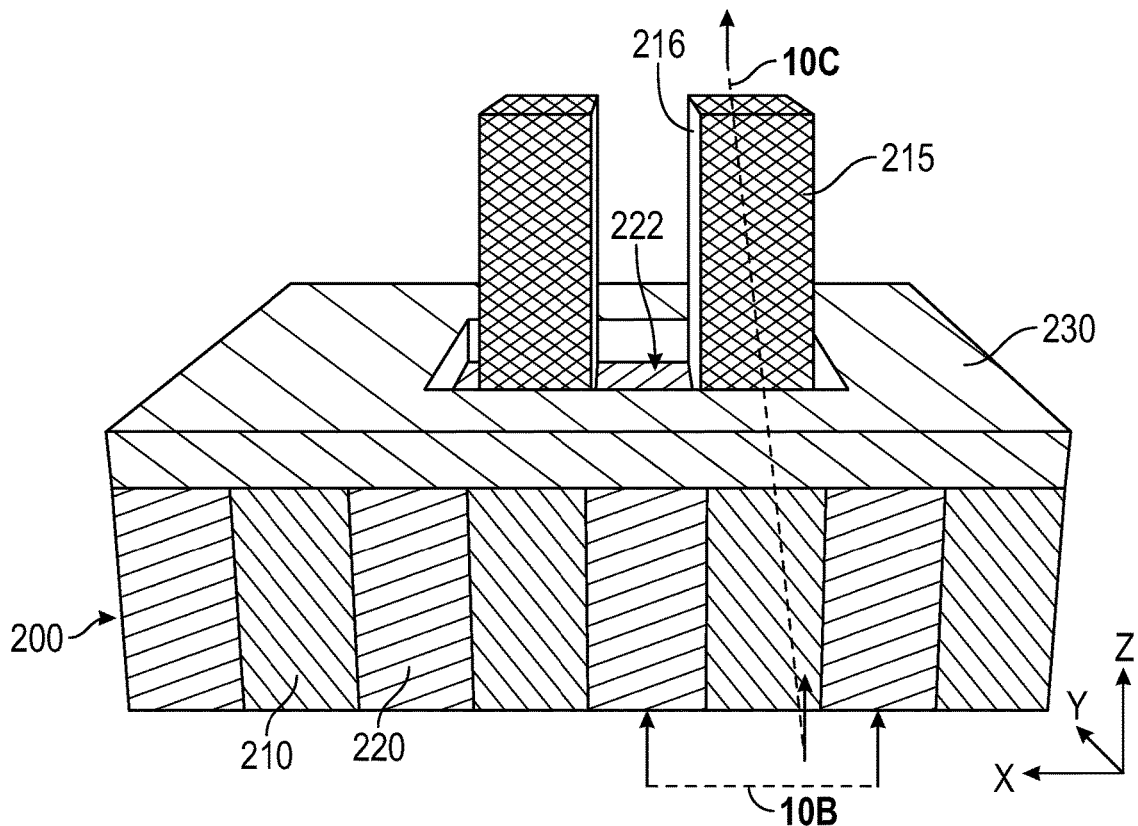
FIG. 10A
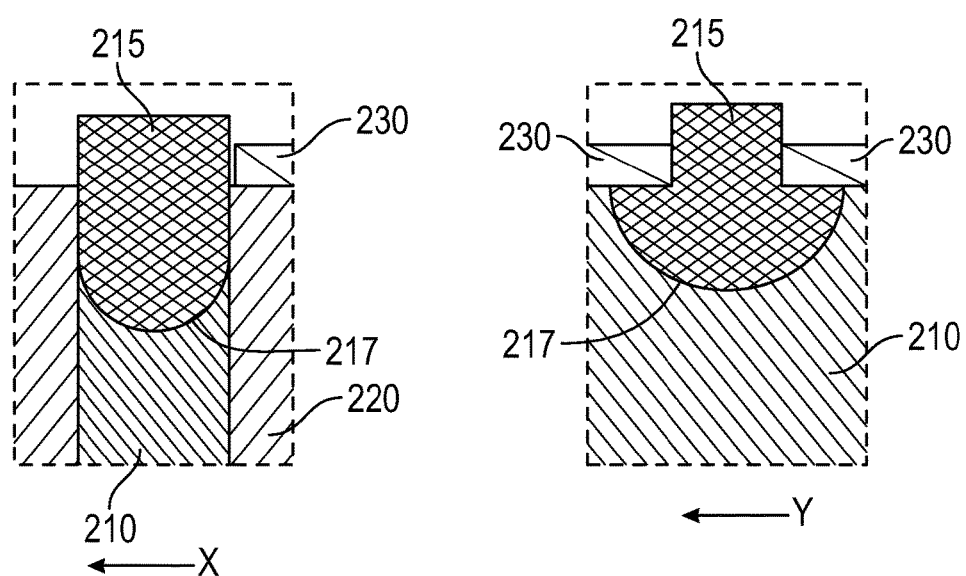
FIG. 10B
FIG. 10C

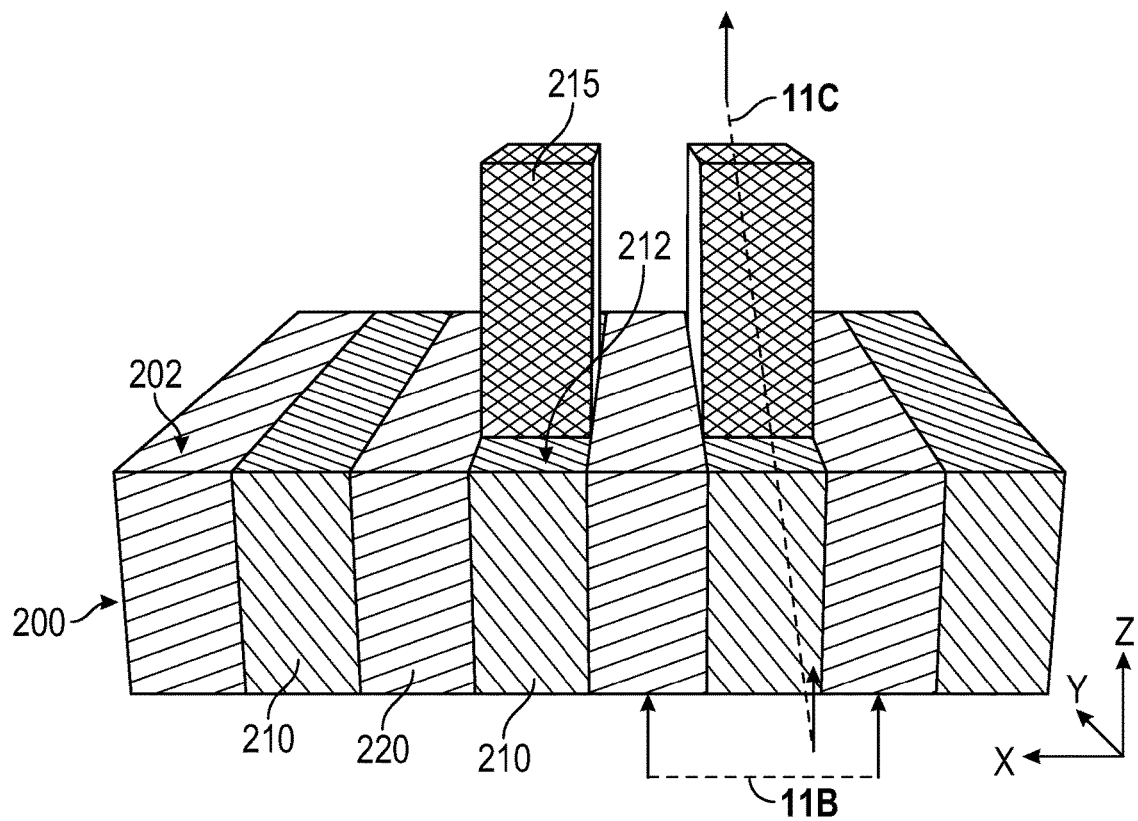
FIG. 11A
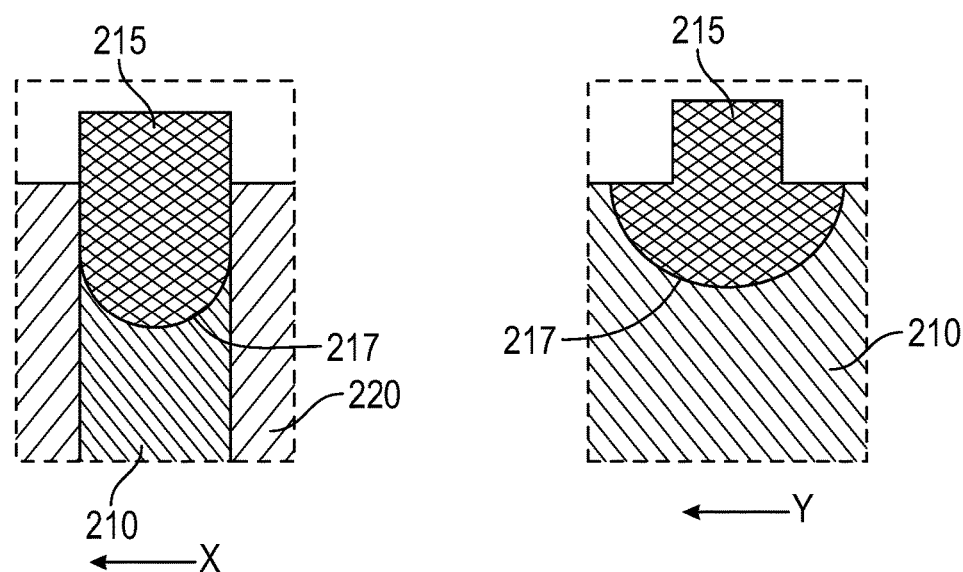
FIG. 11B
FIG. 11C

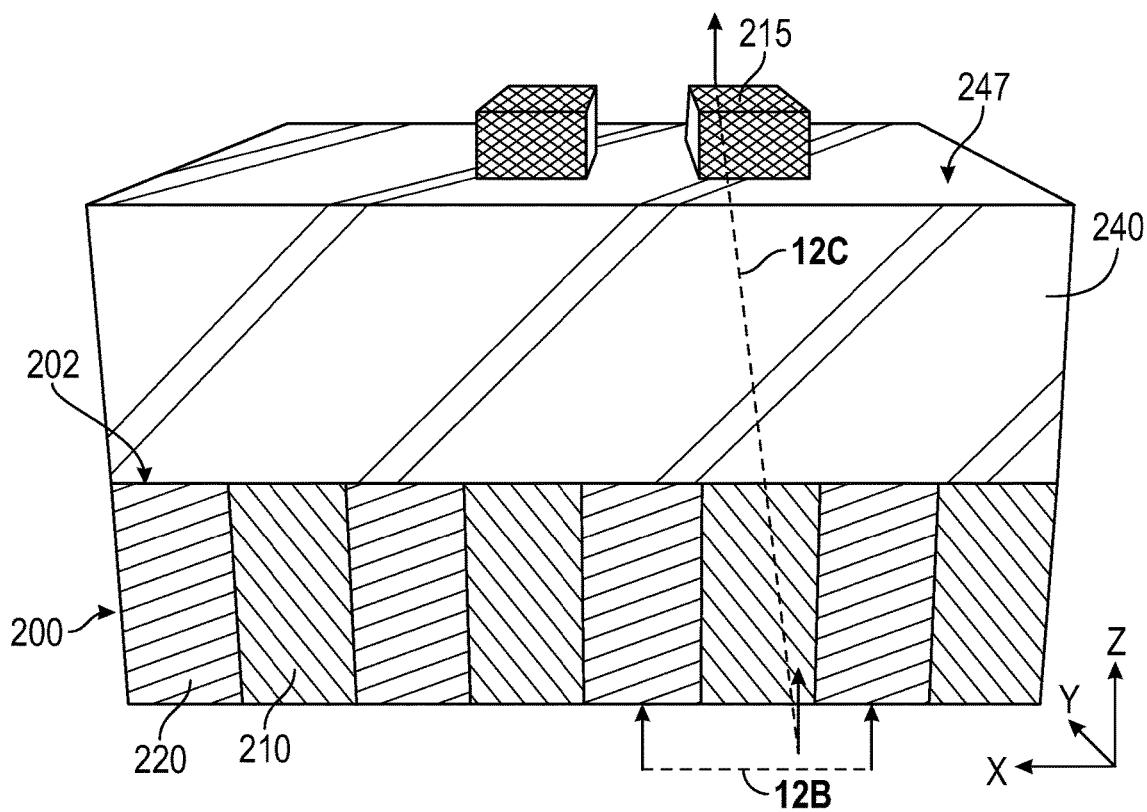
FIG. 12A
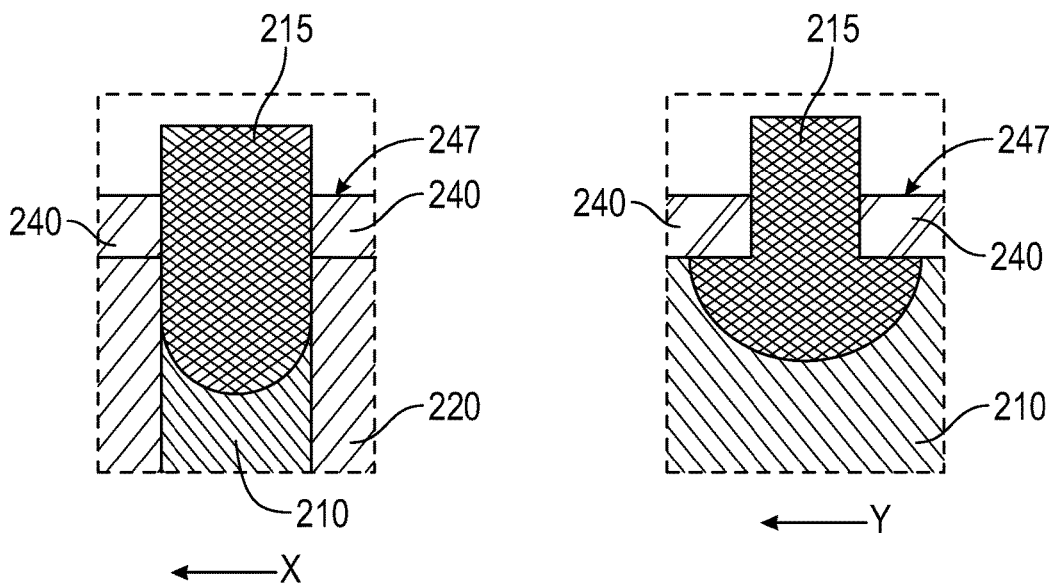
FIG. 12B
FIG. 12C

GEOMETRIC CONTROL OF BOTTOM-UP PILLARS FOR PATTERNING APPLICATIONS

CROSS-REFERENCE TO RELATED APPLICATIONS

This application claims priority to U.S. Provisional Application No. 62/419,228, filed Nov. 8, 2016, the entire disclosure of which is hereby incorporated by reference herein.

TECHNICAL FIELD

The present disclosure relates generally to methods of depositing and etching thin films. In particular, the disclosure relates to processes for forming self-aligned patterning.

BACKGROUND

The semiconductor industry is rapidly developing chips with smaller and smaller transistor dimensions to gain more functionality per unit area. As the dimensions of devices continue to shrink, so does the gap/space between the devices, increasing the difficulty to physically isolate the devices from one another. Filling in the high aspect ratio trenches/spaces/gaps between devices which are often irregularly shaped with high-quality dielectric materials is becoming an increasing challenge to implementation with existing methods including gapfill, hardmasks and spacer applications.

Integrated circuits are made possible by processes which produce intricately patterned material layers on substrate surfaces. Producing patterned materials on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping, for example, pattern transfer processes. Such an etch process is said to be selective of the first material. As a result of the diversity of materials, circuits and processes, etch processes have been developed that selectively remove one or more of a broad range of materials.

Dry etch processes are often used for selectively removing material from semiconductor substrates. The dry etch process has the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. Many dry etch processes have recently been developed to selectively remove a variety of dielectrics relative to one another. However, relatively few dry-etch processes have been developed to selectively remove metal-containing materials. Methods are needed to broaden the process sequences to various metal-containing materials.

As the feature size of circuits and semiconductor devices keeps shrinking for higher integration density of electronic components, the self-aligned contact is becoming more and more attractive and highly required to solve increasingly-appeared patterning difficulties during via process. Generally, making the self-aligned contact needs bottom-up pillars, which however are very hard to be formed, especially when the material, shape, feature size, direction etc. are highly restricted. So far, most bottom-up pillars developed for self-aligned contacts are conductive metals, vertically aligned with submicron feature size and uncontrollable shapes.

Therefore, there is a need in the art for new methods for self-aligned patterning applications.

SUMMARY

One or more embodiments of the disclosure are directed to processing methods comprising providing a substrate with a substrate surface having at least one feature extending into the substrate from the substrate surface. The feature has a bottom and sidewalls. The substrate comprises a first material. A first pillar is positioned within the feature and extends out of the feature to a first pillar top. The first pillar extends from the feature orthogonally to the substrate surface. A first film is deposited on the substrate surface so that the first film covers the substrate surface and the first pillar material. The first film is removed from to expose the first pillar top through the first film. The first pillar material is removed to leave an empty feature in the substrate and a passage through the first film. A second film is deposited on the first film so that the second film fills the feature in the substrate and the passage through the first film to form a second pillar. The second film is removed to expose the first film and a top of the second pillar. The first film is removed to leave the substrate with the second pillar in the feature and extending orthogonally to the substrate surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 8A through 15C show perspective and cross-sectional views of a substrate processed in accordance with one or more embodiment of the disclosure;

Figure 1:
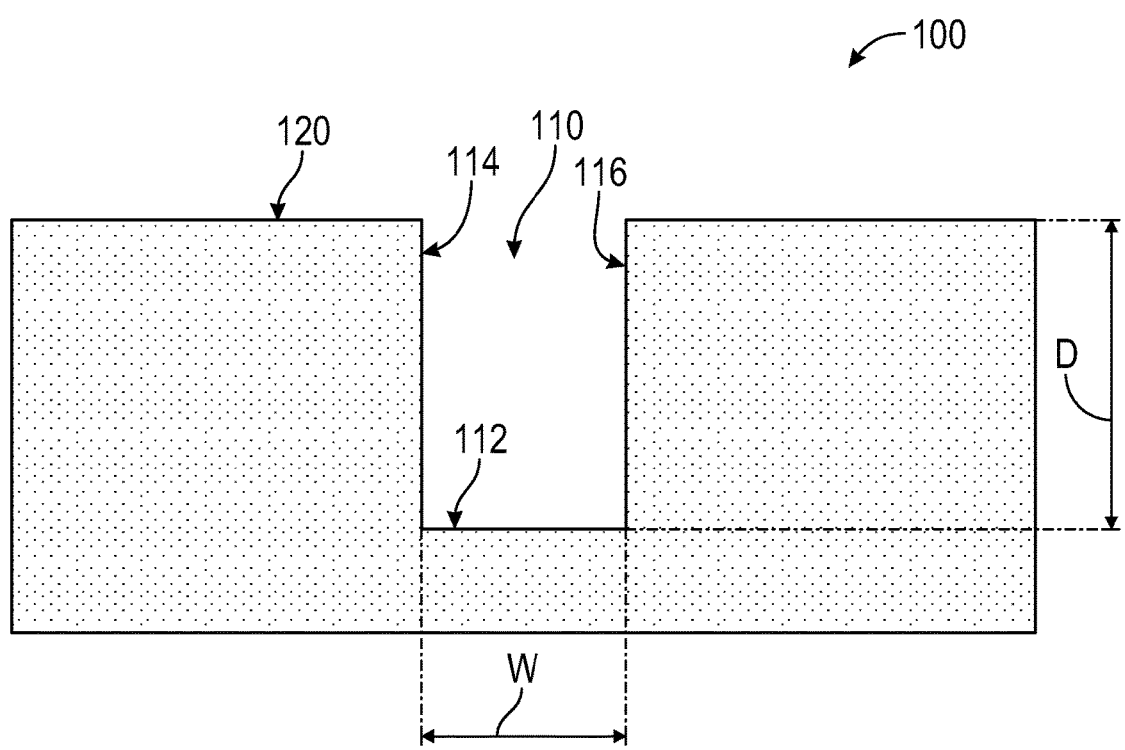
FIG. 1 shows a cross-sectional view of a substrate feature in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

In some integration schemes, oxide films (e.g., tungsten oxide) are selectively etched relative to a dielectric and metal films (e.g., not oxidized tungsten). Embodiments of the disclosure provide methods using metal halides for complete etching of oxides selective to metal and dielectric films. In some cases, the oxide film being etched sticks above the surface of the substrate. In some embodiments, the oxide film being etched sticks above the surface of the dielectric. In one or more embodiments, the oxide being etched is surrounded by a mask.

One or more embodiments of the disclosure are directed to methods for depositing metal oxide films for any conformal and/or low to high aspect ratio gap/trench/void filling applications. Embodiments of the disclosure advantageously provide methods of depositing a film (e.g., a metal oxide film) in high aspect ratio (AR) structures with small dimensions. Some embodiments of the disclosure advantageously provide methods of filling gaps without formation of a seam in the gap. One or more embodiments of the disclosure advantageously provide methods of forming self-aligned vias.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls extending upward from a surface and vias which have sidewalls extending down from a surface with an open bottom. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a substrate surface 120 with at least one feature 110 forming an opening in the substrate surface 120. The feature 110 extends from the substrate surface 120 to a depth D to a bottom surface 112. The feature 110 has a first sidewall 114 and a second sidewall 116 that define a width W of the feature 110. The open area formed by the sidewalls and bottom are also referred to as a gap or trench.

Figure 2A:
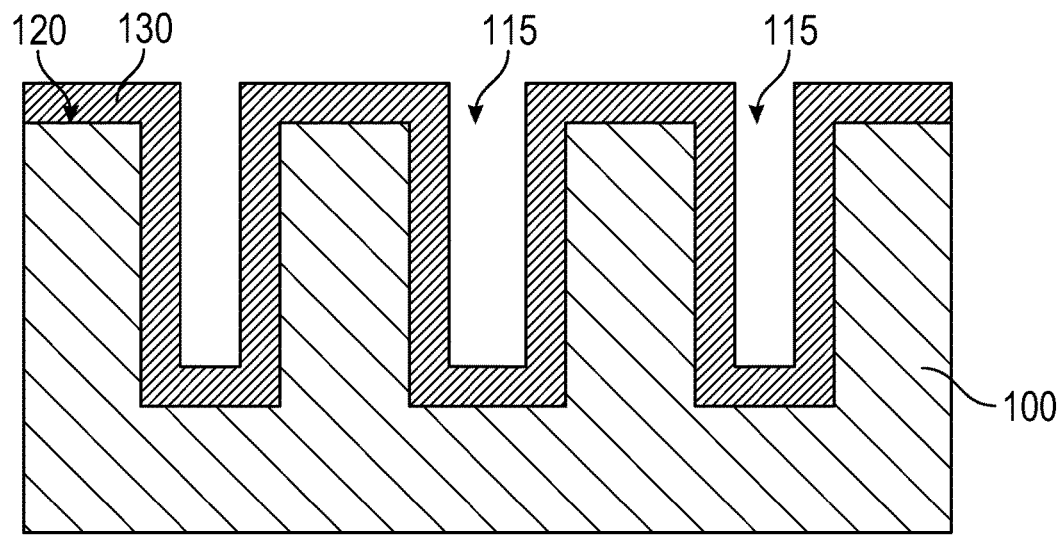
FIGS. 2A and 2B show a cross-sectional schematic of a gapfill process in accordance with one or more embodiment of the disclosure.
Figure 2B:
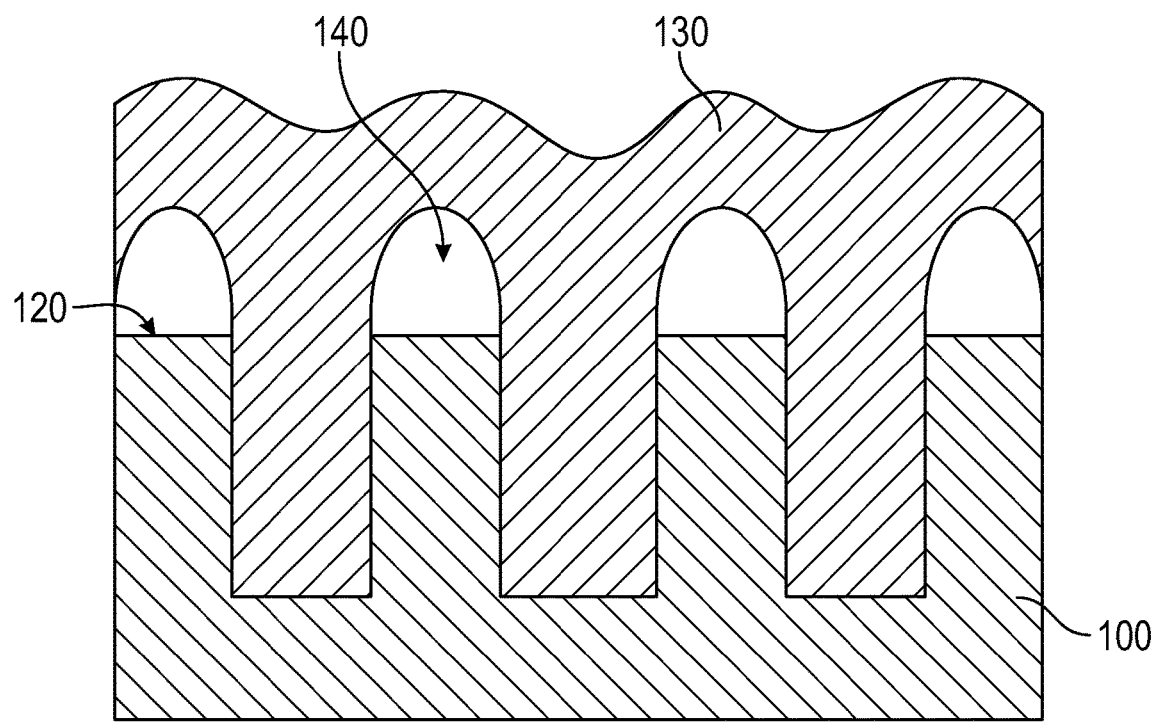

With reference to FIGS. 2A and 2B, the substrate 100 is provided for processing. As used in this regard, the term "provided" means that the substrate is placed into a position or environment for further processing.

A film 130 is formed on the substrate surface 120 and the walls and bottom of the feature 110. The film 130 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the film 130 is formed by atomic layer deposition or plasma-enhanced atomic layer deposition.

In some embodiments, the film 130 is a metal film or a metal containing film. Suitable metal films include, but are not limited to, films including one or more of Co, Mo, W, Ta, Ti, Ru, Rh, Cu, Fe, Mn, V, Nb, Hf, Zr, Y, Al, Sn, Cr and/or La. In some embodiments, the metal film comprises tungsten. Suitable metal containing films include derivatives of a metal film. Suitable derivatives of the metal film include, but are not limited to, nitride, boride, carbide, oxynitride, oxyboride, oxycarbide, carbonitride, borocarbide, boronitride, borocarbonitride, borooxycarbonitride, oxycarbonitride, borooxycarbide and borooxynitride. Those skilled in the art will understand that the metal film deposited may have a non-stoichiometric amount of atoms within the metal film. For example, a film designated as WN may have different amounts of tungsten and nitrogen than the 1:1 stoichiometry suggested by the use of "WN". The WN film may be, for example, 90 atomic % tungsten. The use of WN to describe a tungsten nitride film means that the film comprises tungsten and nitrogen atoms and should not be taken as limiting the film to a specific composition. In some embodiments, the film consists essentially of the designated atoms. For example, a film consisting essentially of WN means that the composition of the film is greater than or equal to about 95%, 98% or 99% tungsten and nitrogen atoms. In some embodiments, the film 130 comprises tungsten. In some embodiments, the film 130 consists essentially of tungsten. In one or more embodiments, the film comprises titanium. In some embodiments, the film consists essentially of titanium or titanium nitride.

In some embodiments, the film 130 forms conformally on the at least one feature 110. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the film 130 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the film 130 is formed substantially seamlessly within the feature 110. In some embodiments, a seam 115 may be formed within the width W of the feature 110. The seam 115 can be any gap, space or void that forms between the walls 114, 116 of the feature 110.

The film 130 is then oxidized by exposure to an oxidizing agent or oxidizing conditions to convert the metal or metal containing film to a metal oxide film. As shown in FIG. 2B, the oxidative conversion causes a volumetric expansion of the original film 130. The expansion of the film 130 can be in the range of about 10% to about 1000%, or in the range of about 50% to about 800%, or in the range of about 100% to about 700%. In some embodiments, the film 130 expands by an amount greater than or equal to about 150%, 200%, 250%, 300% or 350%. In some embodiments, the film 130 expands an amount in the range of about 300% to about 400%. As shown in FIG. 2B, the expansion of the film 130 causes the seam 115 to become filled.

The oxidizing agent can be any suitable oxidizing agent including, but not limited to, $O_2$, $O_3$, $N_2O$, $H_2O$, $H_2O_2$, $CO$, $CO_2$, $NH_3$, $N_2/Ar$, $N_2/He$, $N_2/Ar/He$ and combinations thereof. In some embodiments, the oxidizing conditions comprise a thermal oxidation, plasma enhanced oxidation, remote plasma oxidation, microwave and radio-frequency (e.g., ICP, CCP).

Oxidation of the film 130 can occur at any suitable temperature depending on, for example, the composition of the film and the oxidizing agent. In some embodiments, the oxidation occurs at a temperature in the range of about 25° C. to about 1100° C. In some embodiments, oxidation occurs at a temperature greater than or equal to about 250° C., 300° C., 350° C., 400° C., 450° C., 500° C. or 550° C.

In some embodiments, the film 130 is deposited to a thickness in the range of about 25 Å to about 200 Å, or in the range of about 50 Å to about 150 Å. In one or more embodiments, the film 130 is deposited to a thickness of about 50 Å and there is substantially no seam formed in the film. The formation of the seam occurs where the thickness of the film closes on the top part of the feature 110 before the feature is filled with the film. In some embodiments, the substrate surface has a film with a seam between the sidewalls of the at least one feature. As used in this regard, the term "between" means that there is some film on either side of the seam between the seam and the sidewall of the feature. The seam is not limited to being exactly in the center of the sidewalls.

During expansion of the film 130 by oxidation, a gap 140 is formed on top of the substrate surface 120. The gap 140 can have contents that match the oxidation environment or can be of a different composition. For example, an oxidation environment using nitrogen plasma may form a gap 140 with a nitrogen environment.

Figure 3:
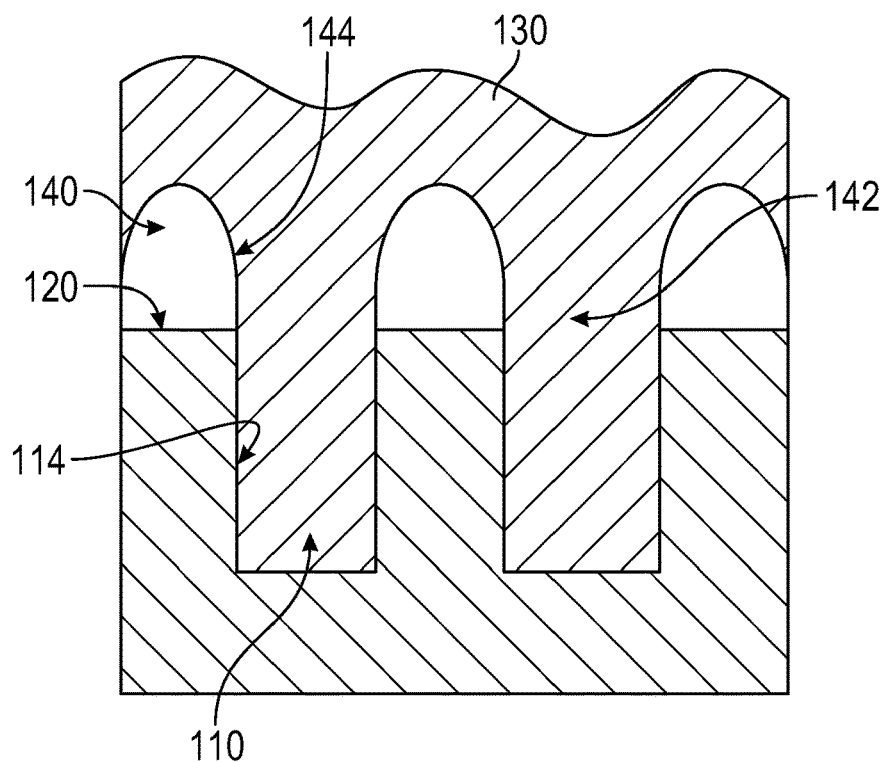
FIG. 3 shows a cross-sectional view of an oxidized film in accordance with one or more embodiment of the disclosure.

As shown in FIG. 3, during expansion, the fidelity of the feature shape is maintained on the top of the feature so that the film 130 grows straight up from the feature 110. As used in this regard, "straight up" means that the film forms a surface 144 around the gap 140 and that the portion of the surface 144 adjacent the feature sidewall 114 is substantially coplanar with the sidewall 114. A surface 144 is coplanar with the sidewall 114 where the angle formed at the junction of the sidewall 114 and the surface 144 is ±10°. Expansion of this sort was expected to grow isotropically to form mushroom shaped top. The expansion of the film 130 to form a straight segment 142 was unexpected.

In some embodiments, the film 130 is doped with a dopant prior to oxidation. The dopant can be incorporated into the film 130 at the same time as the formation of the film 130 or in a separate process sequentially with the film deposition. For example, depositing the film 130 may occur followed by doping the film 130 with the dopant in a separate process in either the same process chamber or a different process chamber. In some embodiments, the deposition of the film 130 occurs with the doping in a single process. For example, the film precursor and dopant can be coflowed into the processing chamber to form the film 130.

Some embodiments include an optional treatment process. The treatment process treats the film 130 to improve some parameter of the film. In some embodiments, the treatment process comprises annealing the film. In some embodiments, treatment can be performed by in-situ anneal in the same process chamber used for deposition and/or reduction. Suitable annealing processes include, but are not limited to, rapid thermal processing (RTP) or rapid thermal anneal (RTA), spike anneal, or UV cure, or e-beam cure and/or laser anneal. The anneal temperature can be in the range of about 500° C. to 900° C. The composition of the environment during anneal may include one or more of $H_2$, Ar, He, $N_2$, $NH_3$, $SiH_4$, etc. The pressure during the anneal can be in the range of about 100 mTorr to about 1 atm (760 Torr).

Figure 4:
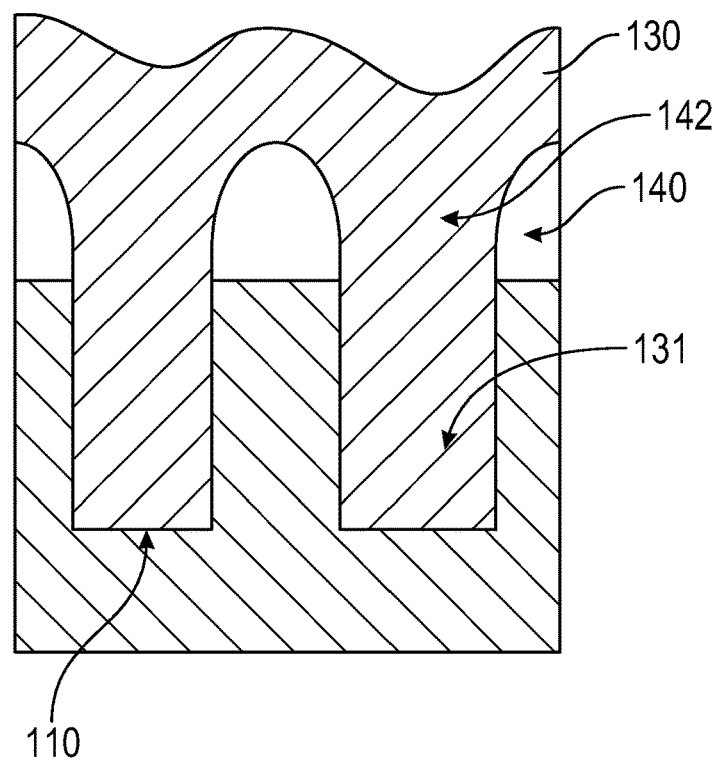
FIG. 4 shows a cross-sectional view of an oxidized film in accordance with one or more embodiment of the disclosure.
Figure 5A:
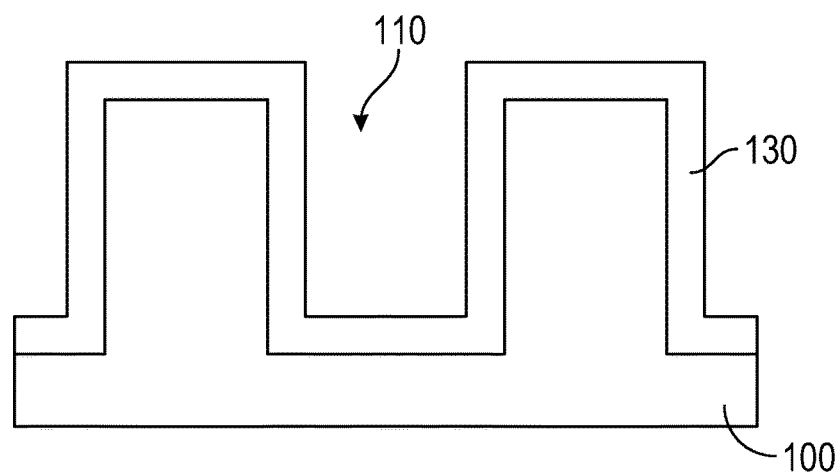
FIGS. 5A through 5C show a cross-sectional schematic of a process in accordance with one or more embodiment of the disclosure.
Figure 5B:
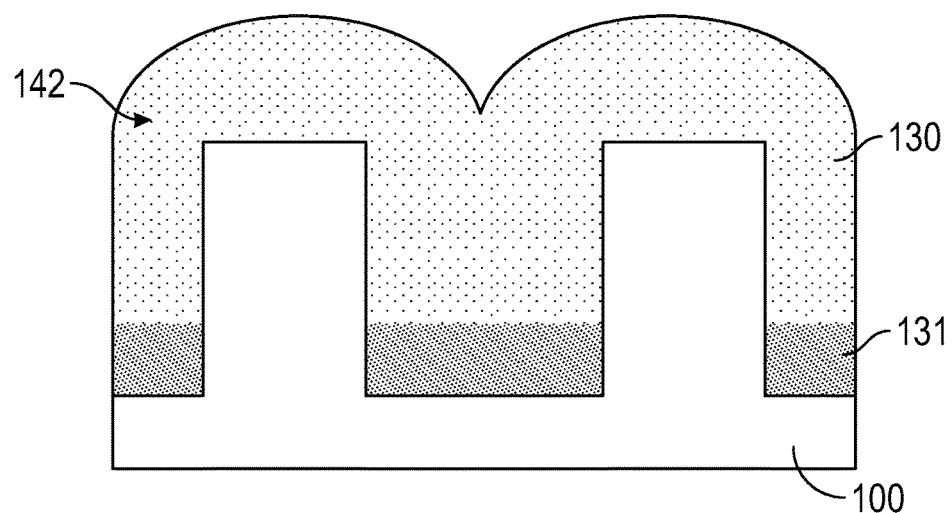
Figure 5C:
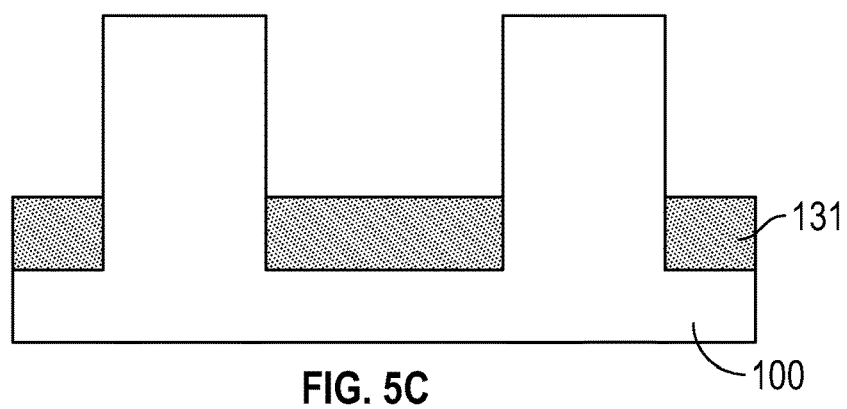

Referring to FIG. 4, in some embodiments there is a greater amount of oxidation at the top portion (the straight segment 142) than at the bottom portion 131 of the feature 110. In some embodiments, there is little or no oxidation of the film 130 at the bottom portion 131 of the feature 110. FIGS. 5A through 5C show a method of depositing a film in a bottom of a feature 110. The film 130 is deposited by any suitable technique. For example, in FIG. 5A a tungsten film can be deposited on the substrate by atomic layer deposition. The film 130 in FIG. 5B has been oxidized and expanded to fill the feature 110. The top portion 142 of the film 130 comprises an oxide of the deposited metal (e.g., tungsten oxide) and the bottom portion 131 of the film 130 remains unoxidized (e.g., tungsten metal). The difference between the top portion 142 and the bottom portion 131 can be used to selectively etch material from the substrate. As shown in FIG. 5C, if the film 130 is deposited to an etch process selective for oxides, the oxide film at the top portion 142 can be removed leaving the metal film at the bottom portion 131.

Figure 6A:
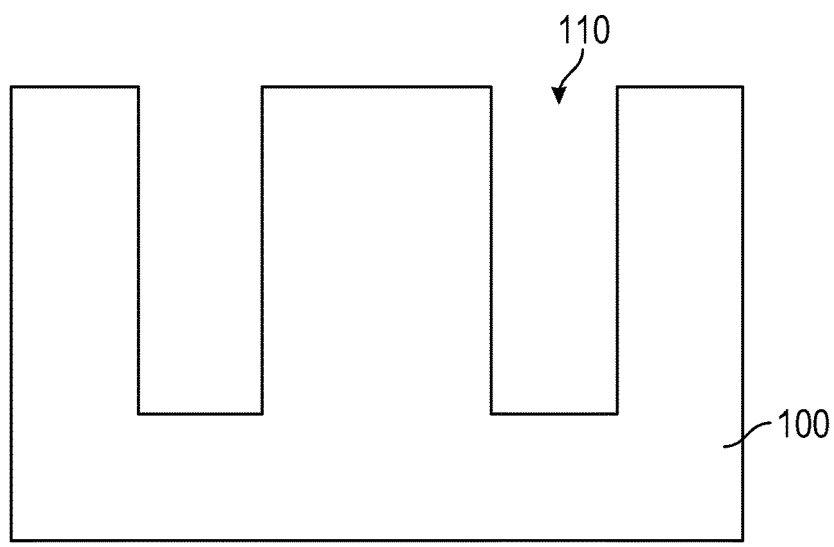
FIGS. 6A through 6C show a cross-sectional schematic of a process in accordance with one or more embodiment of the disclosure.
Figure 6B:
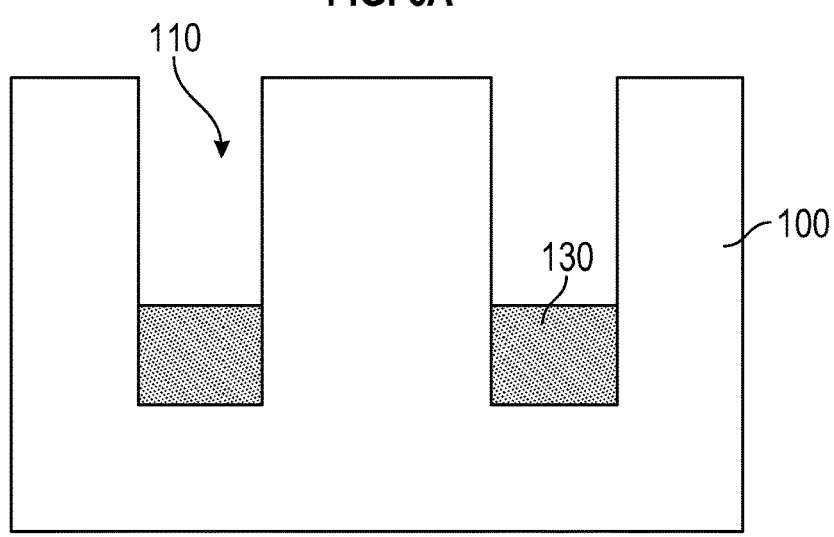
Figure 6C:
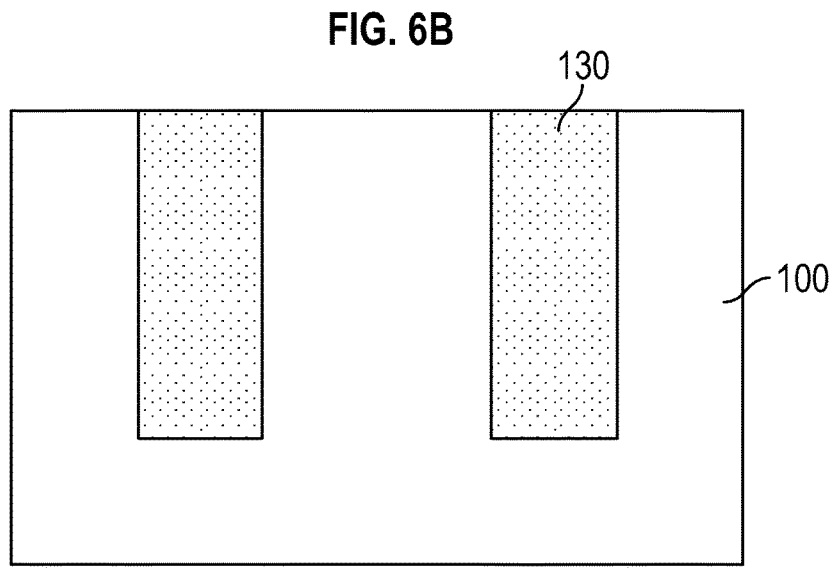

FIGS. 6A through 6C show another embodiment of the disclosure. In FIG. 6A, a substrate 100 with at least one feature 110 is shown. A film 130 is deposited in the bottom of the feature 110, as shown in FIG. 6B. The film 130 can be oxidized, in FIG. 6C, so that the film expands to fill the feature 110.

Figure 7A:
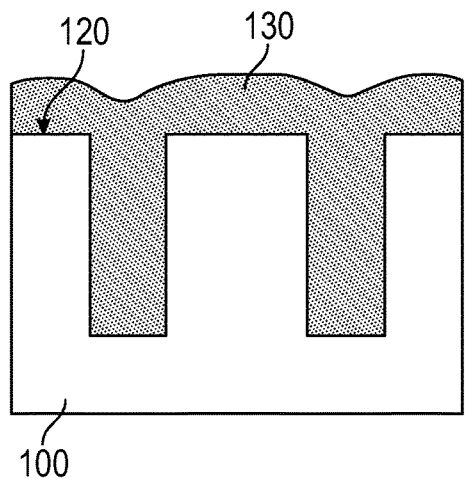
FIGS. 7A through 7D show a cross-sectional schematic of a process in accordance with one or more embodiment of the disclosure.
Figure 7B:
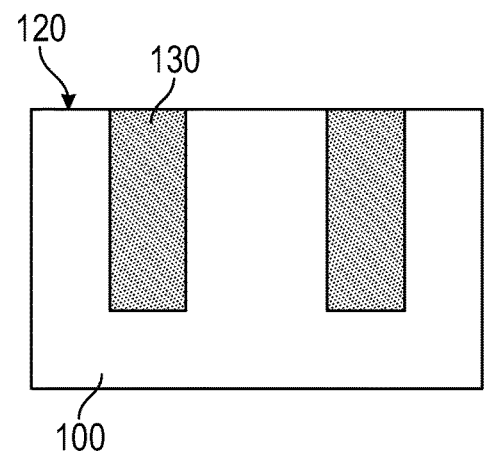
Figure 7C:
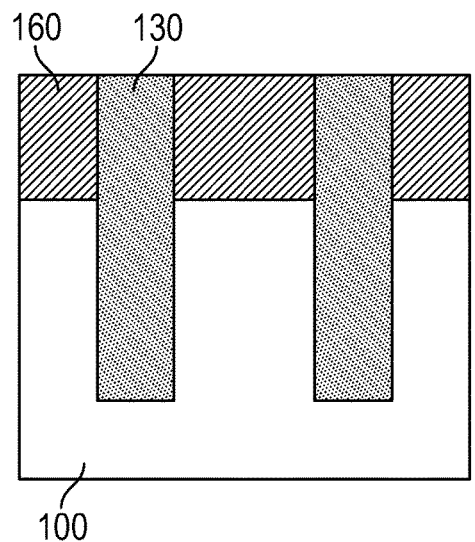
Figure 7D:
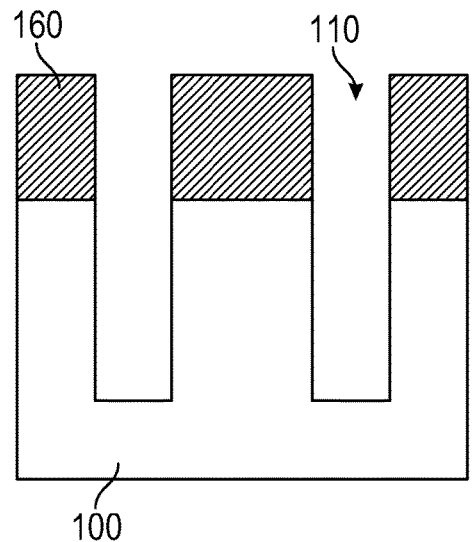

FIGS. 7A through 7D show another embodiment of the disclosure in which a self-aligned via is formed. In FIG. 7A, a substrate with an oxidized film 130 is provided. A polishing or etch process can be performed to remove the top of the film 130 from the surface 120 of the substrate 100, as shown in FIG. 7B. The film 130 remains within and filling the features 110. As shown in FIG. 7C, the film 130 can then be oxidized to cause upward growth the film 130. The sides of the film 130 remain substantially coplanar with the sides of the feature 110 so that there are pillars extending from the features 110. A material layer 160 is deposited on the surface 120 of the substrate 100. As shown in FIG. 7D, the film 130 can be removed (e.g., by etching) to leave the features 110 with the material layer 160 aligned on top of the features 110.

FIGS. 8A through 15C show another embodiment of the disclosure illustrating an alignment process incorporating volumetric expansion of the metal layer. A substrate 200 with a substrate surface 202 is provided. The substrate surface 202 comprises a first material 210 with a first surface 212 and a second material 220 with a second surface 222. In the embodiment shown in the Figures, the substrate surface 202 is the overall plane (for the planar surface shown) made up of the combined surfaces of the first surface 212 and the second surface 222. The embodiment shown uses a substantially planar material comprising a pattern of the first material 210 and the second material 220.

The first material 210 and the second material 220 are different materials. For example, in some embodiments, the first material 210 is a metal and the second material 220 is a dielectric. The first material 210 and the second material 220 can share common elements, but have different surface reactivities. In some embodiments, the metal of the first material 210 is substantially absent from the second material 220. As used in this regard, the term "substantially absent" means that the bulk composition of the second material 220 comprises less than about 1% of the metal, on an atomic basis.

The first material 210 can be any suitable material including, but not limited to, Co, Mo, W, Ta, Ti, Ru, Rh, Cu, Fe, Mn, V, Nb, Hf, Zr, Y, Al, Sn, Cr or La. In some embodiments, the first material 210 comprises one or more of Co, Mo, W, Ta, Ti, Ru, Rh, Cu, Fe, Mn, V, Nb, Hf, Zr, Y, Al, Sn, Cr and/or La. In some embodiments, the first material 210 is selected from the group consisting of Co, Mo, W, Ta, Ti, Ru, Rh, Cu, Fe, Mn, V, Nb, Hf, Zr, Y, Al, Sn, Cr, La and combinations thereof. Suitable metals may include one or more of titanium, hafnium, zirconium, vanadium, niobium, tantalum, chromium, molybdenum, tungsten, manganese, rhenium, technetium, iron, aluminum and gallium in embodiments. The metal layer may comprise or consist of a metal element in embodiments. The metal element may have an atomic number of 22, 23, 24, 40, 41, 42, 72, 73 or 74 according to one or more embodiments. The metal element may be from one of group 4, group 5 or group 6 of the periodic table, in embodiments, or may be a transition metal. In one or more embodiment, the first material 210 comprises tungsten.

Figure 8A:
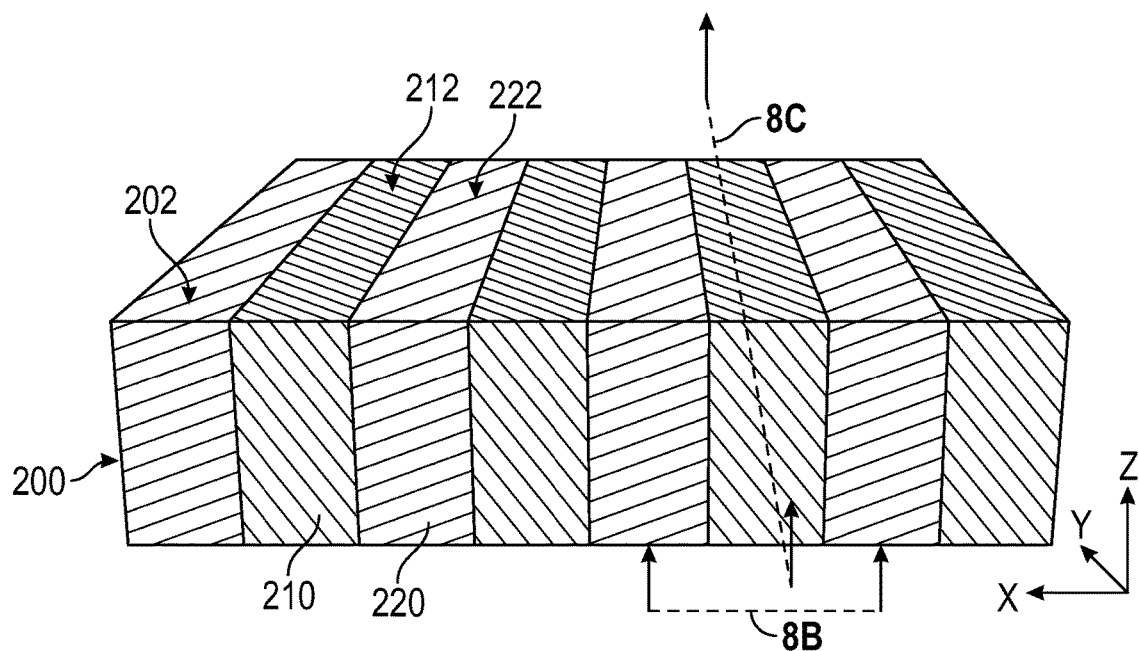
Figure 8B:
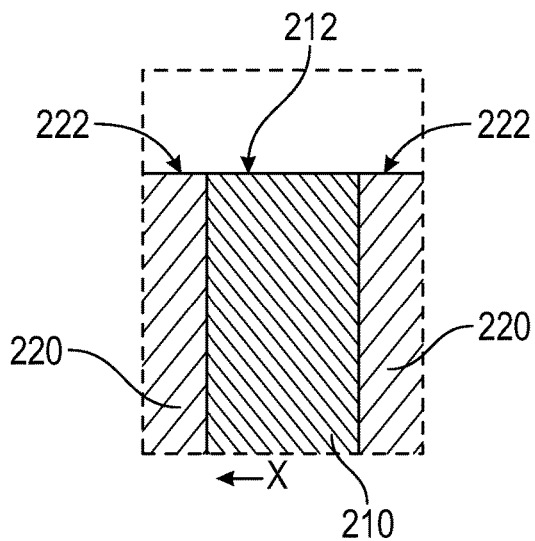
Figure 8C:
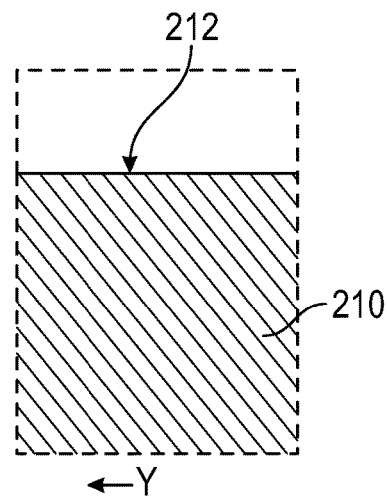

FIG. 8B shows a partial view of the substrate 200 of FIG. 8A viewed along the x-z plane. Each of FIGS. 8B, 9B, 10B, 11B, 12B, 13B, 14B and 15B are shown at the same position. FIG. 8C shows a partial view of the substrate 200 of FIG. 8A viewed along the y-z plane through the first material 210. Each of FIGS. 8C, 9C, 10C, 11C, 12C, 13C, 14C and 15C are shown at the same position. However, for illustrative purposes, the cross-sectional view lines are only shown on FIG. 8A.

As shown in FIGS. 9A to 9C, a mask 230 is formed on the substrate surface 202. The mask 230 has an opening 232 formed therein that exposes at a least a portion of the first surface 212 and the second surface 222. The mask 230 shown has a rectangular opening 232; however, those skilled in the art will understand that this is merely representative of one possible configuration and that other shape openings are within the scope of the disclosure.

The mask 230 can be made from any suitable material that can stop diffusion of an alloying agent, oxidizing agent or other reactive agent, to the surface below the mask 230. For example, the mask 230 shown may allow an oxidizing agent to contact the first surface 212 and second surface 222 within the opening 232 of the mask 230 but will prevent such interaction with surfaces not within the opening 232. Those skilled in the art will understand that the some lateral diffusion and undercutting of the mask 230 may occur during processing.

The mask can be formed by any suitable technique known to those skilled in the art. For example, the mask 230 may be deposited or formed on the surface 202 by one or more of atomic layer deposition, chemical vapor deposition, plasma-enhanced atomic layer deposition, plasma-enhanced chemical vapor deposition, physical vapor deposition or lithography techniques.

As shown in FIGS. 10A through 10C, the first material 210 is expanded. The volumetric expansion of the first material 210 can be done by any suitable means, for example, the processes described with respect to FIGS. 1 through 7D. For example, the first material 210 can be exposed to an oxidizing agent that is selective for the first material 210 relative to the second material 220. The oxidizing agent exposure can result in growth of the first material 210 orthogonally from the first surface 212. The height of the expanded first material 215 is increased from the initial height of the first material 210 to be greater than the height of the second material 220. In some embodiments, the height of the expanded first material 215 is greater than the height of the mask 230.

In some embodiments, expanding the first material 210 causes the first material 210 to expand straight up from the first surface 212 through the opening 232 in the mask 230 to a height greater than the mask 230. As used in this regard, the term "straight up" means that the sides of the expanded first material 215 forms a surface with a sidewall 216 that makes an angle to the substrate surface 202 in the range of about 85° to about 95°.

In some embodiments, expanding the first material 210 comprises one or more of oxidizing or nitriding the first material 210. In one or more embodiments, oxidizing or nitriding the first material 210 to form the expanded first material 215 comprises exposing the first material to an oxidizing agent or nitriding agent comprising one or more of $O_2$, $O_3$, $N_2O$, $H_2O$, $H_2O_2$, CO, $CO_2$, $NH_3$, $N_2H_4$, $NO_2$, $N_2$, $N_2/Ar$, $N_2/He$ or $N_2/Ar/He$. In some embodiments, the oxidizing conditions comprise a thermal oxidation, plasma enhanced oxidation, remote plasma oxidation, microwave and radio-frequency (e.g., ICP, CCP).

For example, in some embodiments, the first material 210 is oxidized by exposure to an oxidizing agent or oxidizing conditions to convert the metal or metal containing film to a metal oxide film. As shown in FIG. 10A, the oxidative conversion causes a volumetric expansion of the original first material 210. The expansion of the first material 210 can be in the range of about 10% to about 1000% of the original (i.e., pre-expanded) thickness. In some embodiments, the first material 210 is expanded in the range of about 50% to about 800%, or in the range of about 100% to about 700% or the original thickness. In some embodiments, the first material 210 expands by an amount greater than or equal to about 150%, 200%, 250%, 300% or 350% of the original thickness.

The height of the expanded first material 215 can be any suitable height measured from the first surface 212.

Expansion of the first material 210 (e.g., by oxidation) can occur at any suitable temperature depending on, for example, the composition of the first material 210 and the oxidizing agent. In some embodiments, the oxidation occurs at a temperature in the range of about 25° C. to about 1100° C. In some embodiments, oxidation occurs at a temperature greater than or equal to about 250° C., 300° C., 350° C., 400° C., 450° C., 500° C. or 550° C.

The expanded first material 215 grows orthogonally from the surface 202 with little or no lateral growth. The tolerances for the positioning of the opening 232 in the mask 230 are less than the tolerances for a process without the orthogonal growth. This is shown in FIG. 10A where the opening 232 in the mask 230 extends onto the second surface 222 on either side of the first surfaces 212 enclosed by the opening 232.

The cross-sectional views of FIGS. 10B and 10C show an interface 217 between the first surface 210 and the expanded first surface 215. The interface 217 shown is a discrete border; however, those skilled in the art will understand that the interface is generally a more diffuse region where the first material 210 transitions to the expanded first material 215.

The expansion of the first material 210, as shown in FIG. 10C, may include an amount of lateral growth. This can be seen in the upside-down mushroom shape of the expanded first material 215. The lateral growth may be symmetrical or asymmetrical.

Referring to FIGS. 11A through 11C, the mask 230 is removed from the substrate 200 to leave the expanded first material 215 extending orthogonally from the substrate surface 202 and the first surface 212.

In some embodiments, as shown in FIGS. 12A through 12C, the method further comprises depositing a third material 240 on the substrate surface 202. The third material 240 surrounds the orthogonally grown expanded first material 215 that extends from the substrate surface 202 and the first surface 212. The third material 240 can have a height substantially the same as or less than the height of the expanded first material 215. The height of the third material 240 in some embodiments is less than the height of the expanded first material 215, as shown, so that the top of the expanded first material 215 is not covered by the third material 240.

The third material 240, also referred to as a gapfill material, is deposited selectively on the substrate surface 202, the first surface 212 of the first material 210 and the second surface 222 of the second material 220 relative to the expanded first material 215. For example, if the expanded first material 215 comprises an oxide (e.g., tungsten oxide), the third material 240 comprises a suitable chemistry that is less reactive to the oxide than the surface materials surrounding the oxide of the first material.

The third material 240 can be deposited by any suitable means. For example, the third material 240 can be deposited by atomic layer deposition, plasma-enhanced atomic layer deposition, chemical vapor deposition, plasma-enhanced chemical vapor deposition or physical vapor deposition.

The third material 240 can be any suitable material that can be selectively deposited on the substrate surface 202 relative to the expanded first material 215. In one or more embodiments, the third material 240 comprises a dielectric. In some embodiments, the third material 240 is different from the first material 210 and the second material 220.

Figure 13A:
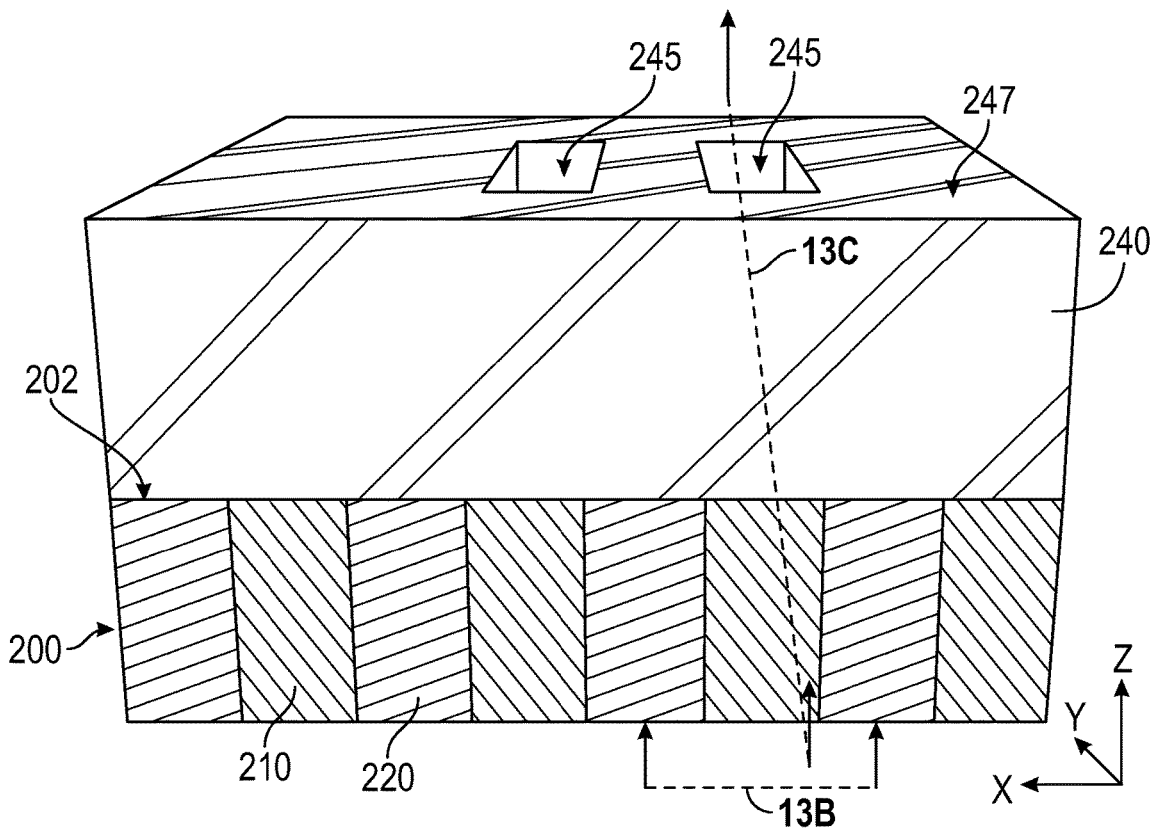
Figure 13B:
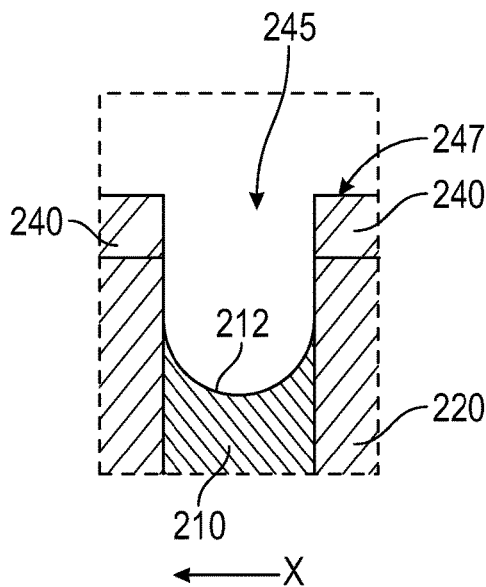
Figure 13C:
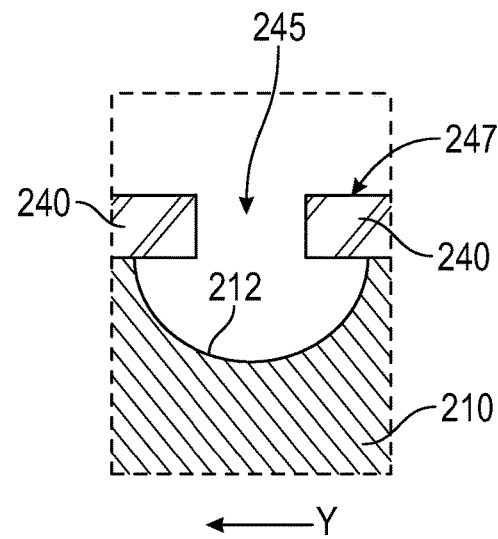

In some embodiments, as shown in FIGS. 13A through 13C, the expanded first material 215 is removed (e.g., etched) from the substrate 200. The etching or removal process can be selective for the expanded first material 215 relative to the third material 240, the first material 210 and/or the second material. Etching of the expanded first material 215 leaves an opening 245 through the third material 240. In FIGS. 13B and 13C, the cross-sectional view of FIG. 13A is shown. Etching removes substantially all of the expanded first material 215 so that the first surface 212 of the first material 210 has moved downward relative to initial position of the first surface 212 in FIG. 8A.

Etching of the expanded first material 215 can be done by any suitable technique. In some embodiments, etching the expanded first material 215 comprises exposing the expanded first material 215 to a metal halide compound. In some embodiments, the metal halide compound has a different metal than the first material 210.

In some embodiments, etching the expanded first material 215 comprises exposure to a metal-and-halogen-containing precursor (e.g. $WCl_6$), also referred to as a metal halide precursor. The metal halide precursor can react with the expanded first material 215.

In some embodiments, exposure to the metal halide precursor causes an exothermic reaction with the expanded first material 215 and no plasma is present in the substrate processing region. No plasma excites the metal-halide precursor prior to entering the substrate processing region according to one or more embodiments.

In an exemplary non-limiting process, the first material 210 comprises tungsten and is expanded by reaction with oxygen to form the expanded first material 215 tungsten oxide, which may take the form of $WO_3$. Exposure of $WO_3$ to $WCl_6$ (or possibly $WCl_5$) forms volatile $WOCl_4$ and/or $WO_2Cl_2$ which leaves the surface until all tungsten oxide is removed. The reaction can spontaneously stop once the tungsten oxide portion (or metal oxide portion in general) is removed. The process can be repeated an integral number of cycles. Each cycle may remove a selectable amount of the original tungsten film (e.g. 1 or 2 monolayers).

In some embodiments, the metal halide precursor includes two or more or only two different elements including a metal element and a halogen element. The metal halide precursor may include only a single atom of the metal element but multiple atoms of the same halogen element (as is the case for $WCl_6$ and $WCl_5$). The metal element of the metal halide may include one or more of titanium, hafnium, zirconium, vanadium, niobium, tantalum, chromium, molybdenum, tungsten, manganese, rhenium, technetium, iron, aluminum and gallium in embodiments. In some embodiments, the metal element of the metal halide has an atomic number of 22, 23, 24, 40, 41, 42, 72, 73 or 74. In one or more embodiments, the metal element comprises an element of group 4, group 5 or group 6 of the periodic table or may be transition metals. The halogen element may be one of F and Cl according to one or more embodiments. The halogen element may be one or more of F, Cl, Br and/or I in some embodiments. In some embodiments, the metal-and-halogen-containing precursor fluorine-free. Some examples of suitable metal halide precursors include, but are not limited to, vanadium pentahalides, tantalum pentahalides, chromium hexahalides, molybdenum pentahalides, molybdenum hexahalides, niobium pentahalides, tungsten pentahalides, tungsten hexahalides, and manganese tetrahalides. In some embodiments, the metal halide precursors include, but are not limited to, vanadium halides, tantalum halides, chromium halides, molybdenum halides, niobium halides, tungsten halides and/or manganese halides, where the oxidation state of the metal element can be any suitable oxidation state.

The etch processes of some embodiments has a selectivity greater than or equal to about 10:1, greater than or equal to about 15:1, greater than or equal to about 20:1 or greater than or equal to about 25:1.

In some embodiments, there is little or no local plasma used in the etch process to make etch processes more selective, delicate and isotropic. The term "plasma-free" will be used herein to describe the substrate processing region during application of no or essentially no plasma power to the substrate processing region. The etchants (the metal-and-halogen-containing precursor) described possess energetically favorable etch reaction pathways which enable the substrate processing region to be plasma-free during operations of etching metal-containing materials herein. Stated another way, the electron temperature in the substrate processing region may be less than 0.5 eV, less than 0.45 eV, less than 0.4 eV, or less than 0.35 eV according to one or more embodiments. Moreover, the metal-and-halogen-containing precursor may have not been excited in any remote plasma prior to entering the substrate processing region in embodiments. For example, if a remote plasma region or a separate chamber region is present and used to conduct the halogen-containing precursor toward the substrate processing region, the separate chamber region or remote plasma region may be plasma-free as defined herein.

The substrate processing region and any remote regions through which the metal-and-halogen-containing precursors pass may be "hydrogen-free" according to one or more embodiments. Hydrogen and —OH groups, in embodiments, may add material to metals and metal nitrides such that the etch process is hindered. The metal film or the metal nitride film may become thicker instead of thinner. The presence of hydrogen in the substrate processing region may reduce the effective etch selectivity.

In some embodiments, the metal-and-halogen-containing precursor (e.g. $WCl_6$) is supplied with a carrier gas at a flow rate of in the range of about 5 sccm and 500 sccm, in the range of about 10 sccm and 300 sccm, in the range of about 25 sccm and 200 sccm, in the range of about 50 sccm and 150 sccm or in the range of about 75 sccm and 125 sccm.

The reactions may proceed thermally, excited only by the temperature of the substrate itself, according to one or more embodiments. In embodiments which use the temperature of the substrate to effect the etching reaction, the term "plasma-free" may be used herein to describe the substrate processing region during application using no or essentially no plasma power. The plasma power may also be kept below small threshold amounts to enable the appropriate reactions to proceed. The plasma power applied to the substrate processing region may be less than 100 watts, less than 50 watts, less than 30 watts, less than 10 watts and may be 0 watts in various embodiments. The pressure within the substrate processing region may be in the range of about 0.1 Torr and 50 Torr, in the range of about 0.2 Torr and 30 Torr, in the range of about 0.5 Torr and 20 Torr, in the range of about 1 Torr and 10 Torr in embodiments.

Figure 14A:
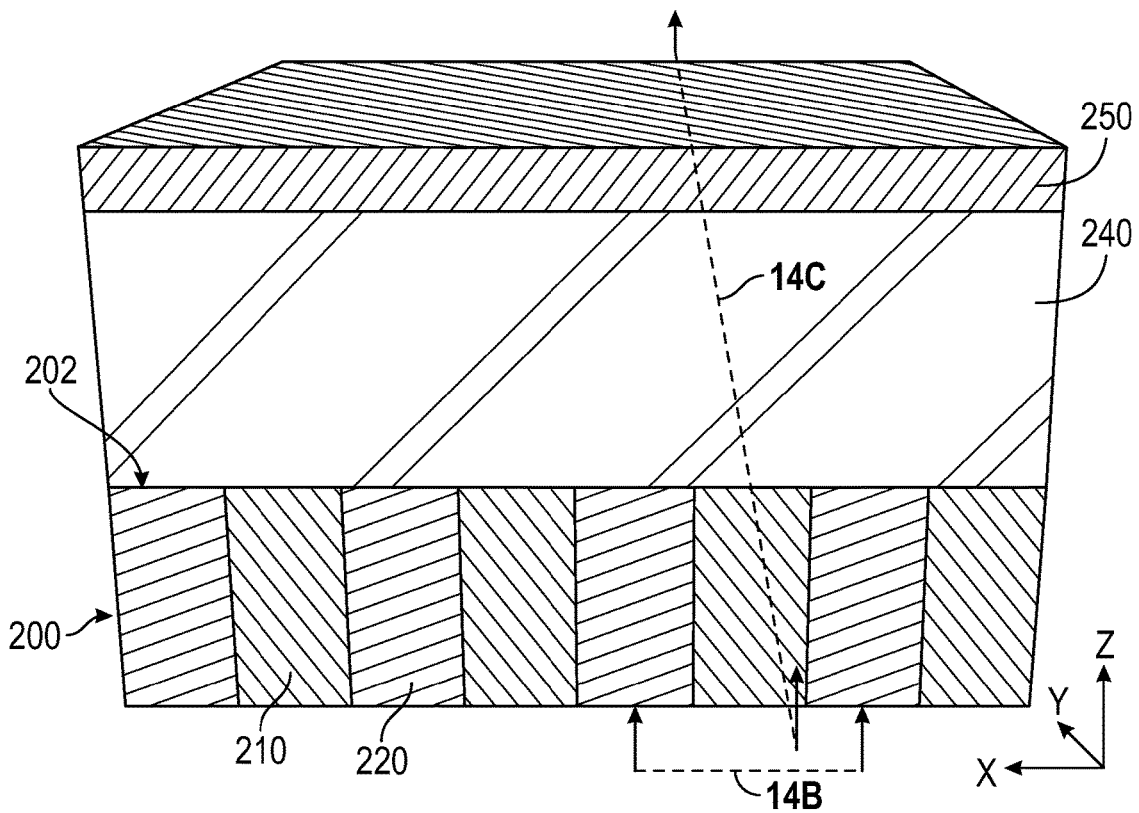
Figure 14B:
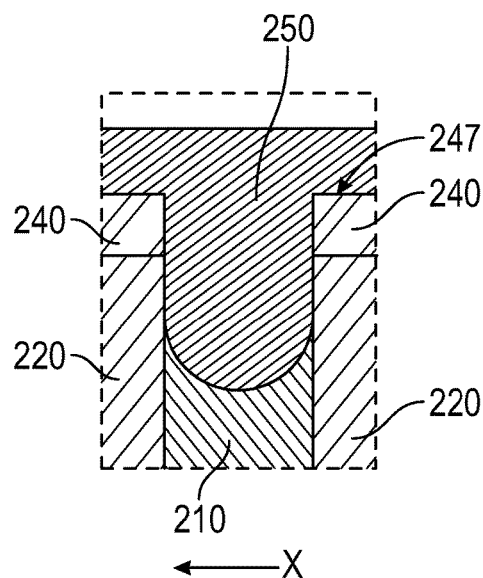
Figure 14C:
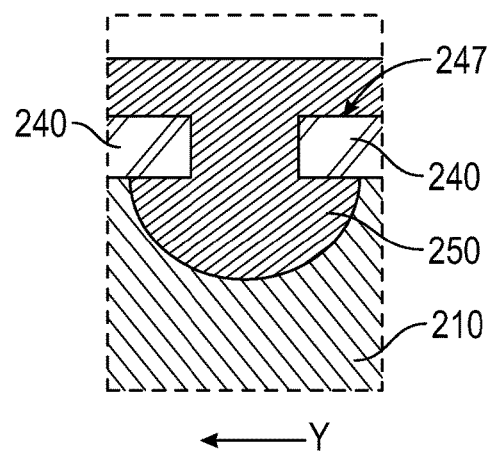

Referring to FIGS. 14A through 14C, some embodiments further comprise depositing a gapfill metal 250 on the surface 247 of the third material 240. The gapfill metal 250 fills the openings 245 in the third material 240 and, as shown in the cross-sectional views of FIGS. 14B and 14C, forms an electrical contact with the first material 210.

The gapfill metal 250 can be any suitable metal which can be the same as the first material 210 or different from the first material 210. In some embodiments, the gapfill metal 250 comprises one or more of titanium, hafnium, zirconium, vanadium, niobium, tantalum, chromium, molybdenum, tungsten, manganese, rhenium, technetium, iron, aluminum and gallium.

Figure 15A:
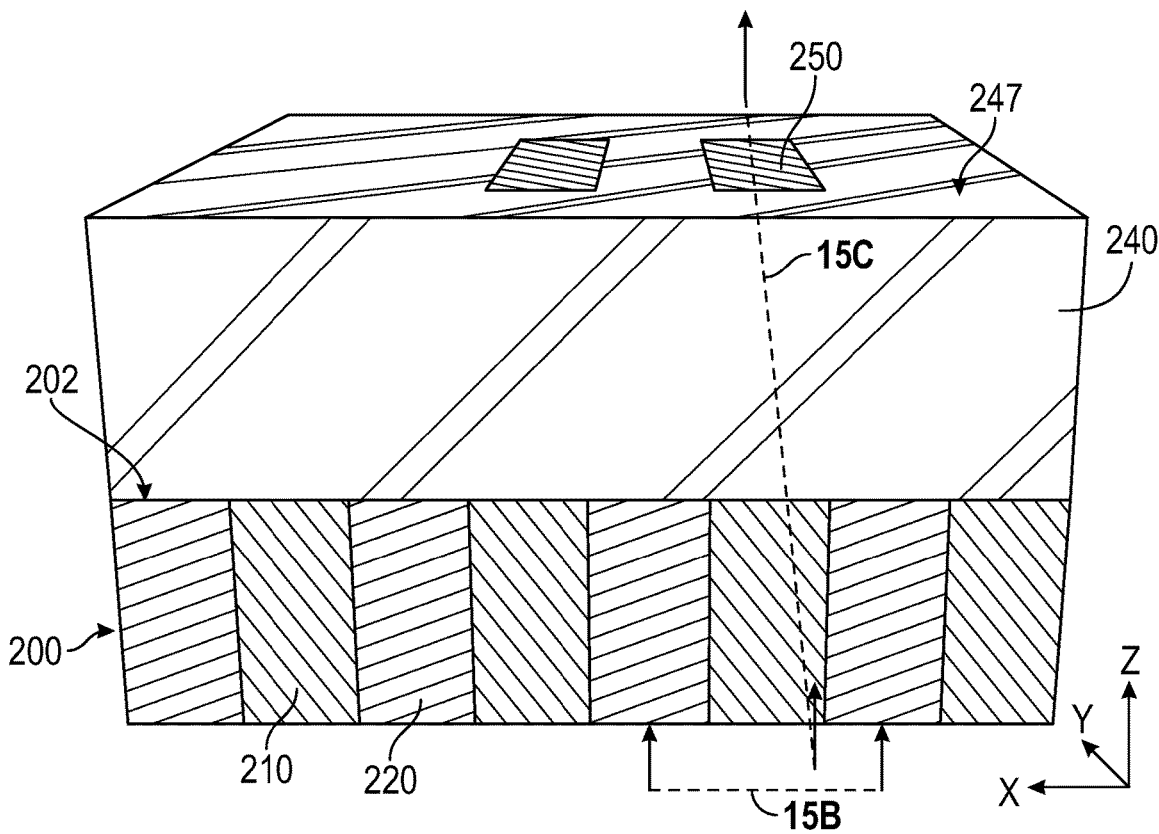
Figure 15B:
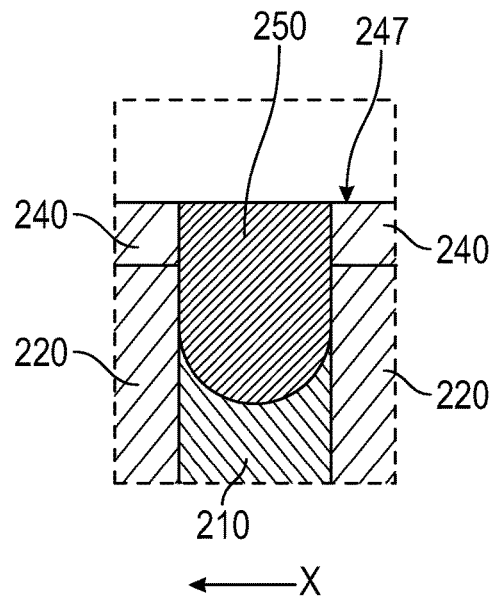
Figure 15C:
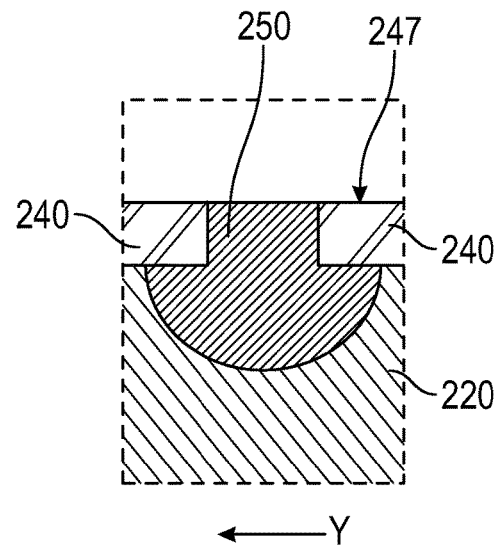
Figures 16A, 16B, 16C, 16D, 16E, 16F:
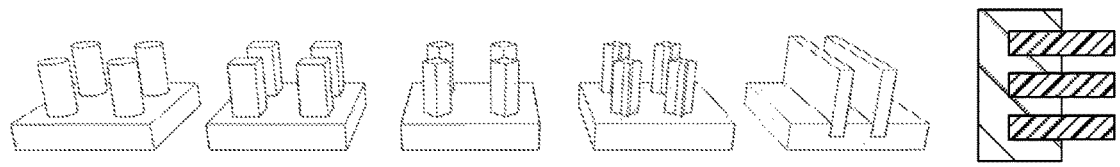
FIGS. 16A through 16F show various pillar shapes in accordance with one or more embodiments of the disclosure.

Referring to FIGS. 15A through 15C, some embodiments further comprise removing the gapfill metal 250 from the surface 247 of the third material 240. Removal of the gapfill metal 250 from the surface 247 leaves the gapfill metal 250 in the openings 245 in the third material 240. This process may produce a self-aligned via providing electrical contact between the first material 210 and a material formed on top of the surface 247 by another process.

Removal of the gapfill metal 250 can be done by any suitable technique. For example, an etch process or a planarization process. In some embodiments, the gapfill metal 250 is removed by polishing the material to leave a substantially smooth surface. Chemical-mechanical planarization (CMP) techniques can be used to polish and smooth the surface 247. During removal of the gapfill metal 250, an amount of the third material 240 may be removed. The amount of the third material 240 removed can be about none to up to about 95% of the original thickness of the third material 240.

Additional embodiments of the disclosure are directed to methods of forming bottom-up pillars with various shapes (e.g. circular, line, square, rhombus, star, etc.) and controllable feature size (from few nanometers to hundreds of nanometer). The pillar can be grown in both vertical and horizontal directions. FIG. 16A through 16F show pillar shapes, in order, circular, square, rhombus, star shaped, linear and horizontal. Those skilled in the art will understand that the disclosure is not limited to the illustrated shapes and the other shapes are within the scope of the disclosure.

It has been found that geometrical control of bottom-up pillars may provide solutions to many patterning difficulties associated with complicated and small features. This kind of bottom-up pillar is formed by oxidizing specific metal materials (such as W, Ru, Mo, Os, V, Ta, Co, Mn, etc.) fully-filled and constrained in holes or trenches structures. When the metal is oxidized to be metal oxide, the volume expansion pushes the metal oxide out of the holes or trenches to form pillars. In some embodiments, the oxygen diffuses into metal materials through the exposed surface to form stable metal oxide only at the interface between metal oxide and metal. In some embodiments, once metal oxide is formed, oxygen diffuse will not further oxidize it to form another phase of oxide. In some embodiments, the oxidization causes volume expansion, i.e., the metal oxide volume should be larger than that of the metal. The shape of the opening and the inside of the hole or trench structure will confine the final pillar shapes. The feature size of pillars is also determined by the feature size of holes or trenches structures. The direction of pillars will depend on how the hole or trench is opened. If the structure opening is on the horizontal surface, the self-aligned pillar will grow vertically. On the other hand, the horizontal pillar can be formed when the structure opening is on a vertical surface like side wall of a deep trench or hole.

The oxidization process can use many kinds of oxidization gases like $O_2$, $O_3$, $H_2O$, $H_2O_2$, $N_2O$, etc. The process can be done either thermally or enhanced by plasma with a temperature varied from 300° C. to 600° C. The RF power for plasma can vary from 200 W to 2000 W and the chamber pressure can change from a few torr to 600 torr.

The pillar material is not limited to metal oxides. In some embodiments, the pillar material comprises a metal nitride or metal silicide. Once formed, the pillars can be replaced by any kind of materials, such as metal, dielectrics, a-Si, a-C, etc., through patterning process as shown in FIG. 17.

FIGS. 17A through 17G illustrate a processing method 300 in accordance with one or more embodiments of the disclosure. A substrate 310 having a substrate surface 315 with at least one feature 320 formed therein. The feature 320 has a bottom 322 and sidewalls 324 and extends a distance from the substrate surface 315 defining a depth of the feature 310.

The substrate 310 is made of a first material. The substrate can be any suitable material as described and discussed herein. A first pillar 330 is positioned within the feature 320 and extends out of the feature 320 to a first pillar top 332. The first pillar 330 extends from the feature 320 orthogonally to the substrate surface 315. The first pillar 330 is made from a first pillar material that can be, for example, a metal, metal oxide or dielectric.

In some embodiments, the first pillar 330 is formed in the feature 320. In some embodiments, forming the first pillar 330 comprises depositing a first pillar material (e.g., a metal) in the feature 320 and expanding the first pillar material straight up to extend above the substrate surface 315. In some embodiments, expanding the first pillar 330 material comprises one or more of oxidizing or nitriding the first pillar 330 material.

Figures 17A, 17B, 17C, 17D:
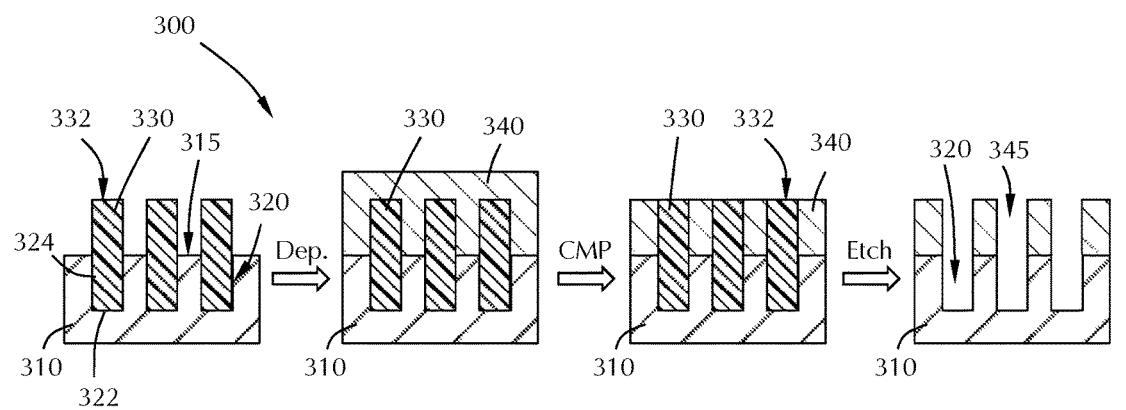
FIGS. 17A through 17G show a process in accordance with one or more embodiments of the disclosure.

As shown in FIG. 17B, a first film 340 is deposited on the substrate surface 315 so that the first film 340 covers the substrate surface 315 and the first pillar 330 material. As used in this manner, "cover" means that the first pillar top 332 has at least some of the first film 340 deposited or formed thereon.

The first film 340 can be deposited or formed by any suitable technique. For example, the first film 340 can be deposited or formed by chemical vapor deposition, atomic layer deposition, a plasma-enhanced CVD or ALD process, or a physical vapor deposition process.

As shown in FIG. 17C, the first film 340 is removed to expose the first pillar top 332 through the first film 340. Removing the first film 340 to expose the first pillar top 332 can be done by any suitable technique. For example, the first film 340 can be removed by etching the first film 340 using any suitable chemical etchant or by a chemical-mechanical planarization (CMP) process. In some embodiments, the first film 340 is removed to expose the first pillar top 332 by CMP.

As shown in FIG. 17D, the first pillar 330 material can be removed to leave an empty feature 320 in the substrate 310 with the first film 340 on the substrate surface 315. The empty feature 320 forms a passage 345 through the first film 340 to the substrate 310.

The first pillar 330 material can be removed by any suitable process. In some embodiments, removing the first pillar 330 material comprises etching the first pillar 330 material. In one or more embodiments, the first pillar 330 material is etched by exposing the first pillar 330 material to a metal halide compound. In some embodiments, the metal halide compound has a different metal than the first pillar 330 material. In some embodiments, the metal halide compound has the same metal as the first pillar 330 material.

Figures 17E, 17F, 17G:
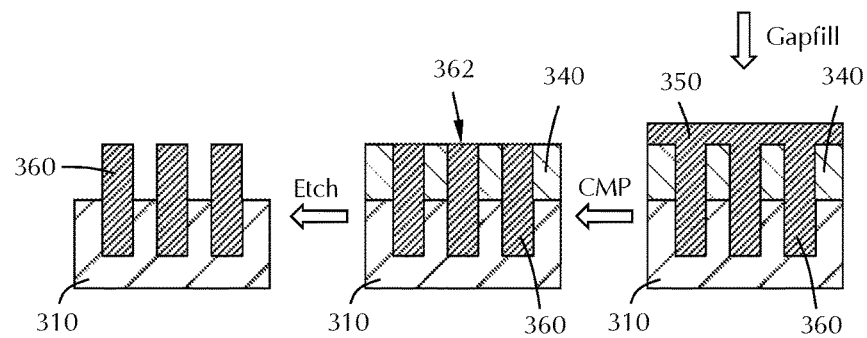

As shown in FIG. 17E, a second film 350 is deposited or formed on the first film 340 so that the second film 350 fills the feature 320 in the substrate 310 and the passage 345 through the first film 340 to form a second pillar 360. The second film 350 can be deposited by any suitable technique of any suitable material. In some embodiments, the second pillar 360 is different from the first pillar 330 material.

As shown in FIG. 17F, the second film 350 can be removed to expose the first film 340 and a top 362 of the second pillar 360. Removing the second film 350 to expose the second pillar 360 top 362 can be done by any suitable technique. For example, the second film 350 can be removed by etching the second film 350 using any suitable chemical etchant or by a chemical-mechanical planarization (CMP) process. In some embodiments, the second film 350 is removed to expose the second pillar 360 top 362 by CMP. In some embodiments, the second pillar 360 comprises a metal or dielectric.

As shown in FIG. 17G, the first film 340 remaining on the substrate 310 can be removed to leave the substrate 310 with the second pillar 360 in the feature 320. The second pillar 360 extends orthogonally to the substrate surface 315 similarly to the first pillar 330 which has been replaced.

In some embodiments, the first film 340 is removed from the substrate 310 by etching. In one or more embodiments, etching the first film 340 comprises exposing the first film 340 to a metal halide compound.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure.

Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
    providing a substrate with a substrate surface having at least one feature extending into the substrate from the substrate surface, the feature having a bottom and sidewalls, the substrate comprising a first material, a first pillar is positioned within the feature and extends out of the feature to a first pillar top so that sides of the first pillar are substantially coplanar with the sidewalls of the feature;
    depositing a first film on the substrate surface so that the first film covers the substrate surface, the sides of the first pillar outside of the feature and the first pillar top;
    removing the first film to expose the first pillar top through the first film;
    removing the first pillar material, to leave an empty feature in the substrate and a passage through the first film;
    depositing a second film on the first film so that the second film fills the feature in the substrate and the passage through the first film to form a second pillar;
    removing the second film to expose the first film and a top of the second pillar; and
    removing the first film to leave the substrate with the second pillar extending out of the feature and so that a portion of sides of the second pillar are outside the feature.

2. The method of claim 1, further comprising forming the first pillar.

3. The method of claim 2, wherein forming the first pillar comprises depositing a first pillar material in the feature and expanding the first pillar material straight up to extend from the substrate surface.

4. The method of claim 3, wherein expanding the first pillar material comprises one or more of oxidizing or nitriding the first pillar material.

5. The method of claim 1, wherein removing the first film to expose the first pillar top comprises a chemical-mechanical planarization process.

6. The method of claim 1, wherein removing the first pillar material comprises etching the first pillar material.

7. The method of claim 6, wherein etching the first pillar material comprises exposing the first pillar material to a metal halide compound.

8. The method of claim 7, wherein the metal halide compound has a different metal than the first pillar material.

9. The method of claim 1, wherein the second pillar is different from the first pillar material.

10. The method of claim 1, wherein removing the second film to expose the first film and the top of the second pillar comprises a chemical-mechanical planarization process.

11. The method of claim 1, wherein removing the first film to leave the substrate with the second pillar comprises etching the first film.

12. The method of claim 11, wherein etching the first film comprises exposing the first film to a metal halide compound.

13. A processing method comprising:
    providing a substrate with a substrate surface having at least one feature extending into the substrate from the substrate surface, the feature having a bottom and sidewalls, and a depth defined from the substrate surface to the bottom of the feature, the substrate comprising a first material;

forming a first pillar within the feature and extending out of the feature to a first pillar top to a height greater than the depth of the feature;

depositing a first film on the substrate surface so that the first film covers the substrate surface, sides of the first pillar material extending out of the feature and the first pillar material;

removing the first film to expose the first pillar top through the first film;

etching the first pillar material to leave an empty feature in the substrate and a passage through the first film;

depositing a second film on the first film so that the second film fills the feature in the substrate and the passage through the first film to form a second pillar comprising a material different than the first pillar;

removing the second film to expose the first film and a top of the second pillar; and etching the first film to leave the substrate with the second pillar extending out of the feature.

14. The method of claim 13, wherein forming the first pillar comprises depositing a first pillar material in the feature and expanding the first pillar material straight up to extend from the substrate surface.

15. The method of claim 14, wherein expanding the first pillar material comprises one or more of oxidizing or nitriding the first pillar material.

16. The method of claim 13, wherein removing the first film to expose the first pillar top comprises a chemical-mechanical planarization process.

17. The method of claim 13, wherein removing the second film to expose the first film and the top of the second pillar comprises a chemical-mechanical planarization process.

18. The method of claim 13, wherein etching the first pillar material and the first film comprises exposing the first pillar material and the first film to a metal halide compound.

19. The method of claim 18, wherein the metal halide compound has a different metal than the first pillar material or the first film.

20. A processing method comprising:

providing a substrate with a substrate surface;

forming at least one feature in the substrate, the at least one feature extending a depth into the substrate from the substrate surface, the feature having a bottom and sidewalls;

forming a first pillar in the feature comprising depositing a metal in the feature and expanding the metal to extend out of the feature to a first pillar top having a height greater than the depth of the feature;

depositing a first film on the substrate surface so that the first film covers the substrate surface, sides of the first pillar outside of the feature and the first pillar material;

removing the first film by chemical-mechanical planarization to expose the first pillar top through the first film;

etching the first pillar material by exposing the first material to a metal halide compound to leave an empty feature in the substrate and a passage through the first film;

depositing a second film on the first film so that the second film fills the feature in the substrate and the passage through the first film to form a second pillar made of a material different than the first material;

removing the second film to expose the first film and a top of the second pillar by chemical-mechanical planarization; and etching the first film by exposing the first film to a metal halide compound to leave the substrate with the second pillar extending out of the feature.

* * * * *

UNITED STATES PATENT AND TRADEMARK OFFICE
CERTIFICATE OF CORRECTION

PATENT NO.        : 10,319,591 B2
APPLICATION NO.   : 15/805753
DATED             : June 11, 2019
INVENTOR(S)       : Duan et al.

Page 1 of 1

It is certified that error appears in the above-identified patent and that said Letters Patent is hereby corrected as shown below:

In the Specification

In Column 5, Line 1, replace "U" with "Å".

Signed and Sealed this
Twenty-third Day of July, 2019

Andrei Iancu
*Director of the United States Patent and Trademark Office*